US006600163B2

(12) United States Patent  (10) Patent No.: US 6,600,163 B2
Halling  (45) Date of Patent: Jul. 29, 2003

(54) IN-PROCESS WAFER CHARGE MONITOR AND CONTROL SYSTEM FOR ION IMPLANTER

(76) Inventor: Alfred M. Halling, 36R Clark St., Danvers, MA (US) 01923-1913

( * ) Notice: Subject to any disclaimer, the term of this patent is extended or adjusted under 35 U.S.C. 154(b) by 0 days.

(21) Appl. No.: 09/748,735

(22) Filed: Dec. 22, 2000

(65) Prior Publication Data

US 2002/0079465 A1 Jun. 27, 2002

(51) Int. Cl.[7] ............................. G21K 5/10; H01J 37/08
(52) U.S. Cl. ................................................. 250/492.21
(58) Field of Search ......................... 250/492.21, 492.2, 250/397, 251

(56) References Cited

U.S. PATENT DOCUMENTS

| | | | | |
|---|---|---|---|---|
| 4,234,797 A | * | 11/1980 | Ryding | 250/442.11 |
| 4,628,209 A | * | 12/1986 | Wittkower | 250/442.11 |
| 4,675,530 A | * | 6/1987 | Rose et al. | 250/492.2 |
| 4,751,393 A | * | 6/1988 | Corey, Jr. et al. | 250/397 |
| 4,812,663 A | | 3/1989 | Douglas-Hamilton et al. | 250/492.2 R |
| 5,378,899 A | * | 1/1995 | Kimber | 250/398 |
| 5,760,409 A | | 6/1998 | Chen et al. | 250/492.21 |
| 5,959,305 A | * | 9/1999 | Mack et al. | 250/251 |
| 5,998,798 A | | 12/1999 | Halling et al. | 250/492.21 |

* cited by examiner

Primary Examiner—John R. Lee
Assistant Examiner—James Leybourne
(74) Attorney, Agent, or Firm—John A. Kastelic; Denis A. Robitaille

(57) ABSTRACT

An in-process charge monitor and control system (32) for an ion implanter is provided, comprising: (i) wafer support (22) upon which a plurality of wafers (W) may be positioned for implantation by an ion beam (18), the support having portions thereof disposed intermediate adjacent wafers that are more or less electrically conductive than surfaces of the wafers, the wafer support (22) further having a center (31) from which each of the plurality of wafers is substantially equidistant, the wafer support further provided with first and second apertures (64, 66) disposed substantially equidistant from the center (31); (ii) first and second electrical charge monitors (40, 38) for receiving first and second portions of the ion beam (18a, 18b) through the first and second apertures (64, 66), respectively, and for outputting first and second output signals (44, 42), respectively, indicative of an amount of ion beam current received; and (iii) a comparator (46) for comparing the first and second output signals (44, 42) and for outputting a third output signal (48) indicative of a difference in ion beam current received by first and second electrical charge monitors (40, 38), wherein the third output signal (48) is used as an input to a charge neutralization system (33) of the ion implanter to control the supply of low energy electrons produced thereby.

17 Claims, 3 Drawing Sheets

IN-PROCESS WAFER CHARGE MONITOR AND CONTROL SYSTEM FOR ION IMPLANTER

FIELD OF THE INVENTION

The present invention relates generally to ion implanters, and more specifically to an in-process wafer charge monitor and control system for such ion implanters.

BACKGROUND OF THE INVENTION

Conventional ion implantation systems, used for doping workpieces such as semiconductors, typically include an ion source that ionizes a desired dopant element which is then accelerated to form an ion beam of prescribed energy. The ion beam is directed at the surface of the workpiece to implant the workpiece with the dopant element. The energetic (generally positive) ions of the ion beam penetrate the surface of the workpiece so that they are embedded into the crystalline lattice of the workpiece material to form a region of desired conductivity. The implantation process is typically performed in a high-vacuum process chamber which prevents dispersion of the ion beam by collisions with residual gas molecules and which minimizes the risk of contamination of the workpiece by airborne particulates.

A problem encountered in the use of such an ion implantation system is that of wafer charging. As the positively charged ion beam continues to impinge upon the target wafer, the surface of the wafer may accumulate an undesirable excessive residual positive charge. In the case of wafers covered by an insulating material such as photoresist, the wafer charging phenomenon is particularly problematic because the charge is isolated from the semiconductive wafer substrate and the pedestal upon which is resides, and cannot therefore be dissipated through the wafer and/or the wafer pedestal.

Excessive charge accumulation can cause resulting electric fields at the wafer surface that can damage microcircuitry on the wafer. The problem of accumulated surface charge becomes more pronounced as implanted circuit elements become smaller, because smaller circuit elements are more susceptible to damage caused by the resultant electric fields.

A known solution to the wafer charging phenomenon is the use of a charge neutralization, or charge control, system. Such a system typically includes a plasma shower that provides a source of low energy electrons that are drawn into the positively charged ion beam passing thereby. Specifically, the plasma shower includes an arc chamber in which an inert gas is ionized to produce a plasma comprised at least partially of low energy electrons, and a plasma chamber into which the plasma is extracted from the arc chamber and through which the ion beam passes. The plasma contains a filament that is electrically heated so that it thermionically emits high energy electrons into the plasma chamber. The high energy electrons collide with the inert gas molecules to create the plasma which includes low energy electrons capable of being trapped within the ion beam. The trapped low energy electrons neutralize the net charge of the ion beam and are transported to the wafer surface by the ion beam. The trapped low energy electrons in the ion beam reduce or neutralize the positive charge accumulation on the wafer surface, caused by the implantation of positive ions, as the ion beam strikes the wafer surface.

Such charge neutralization systems or plasma showers typically include a charge neutralization monitor for monitoring the charge neutralization system to help control the charge neutralization process. Such a system is shown in U.S. Pat. No. 5,959,305 to Mack et al., which discloses a charge neutralization monitor that (i) applies a suitable voltage to a target electrode positioned to collect low energy neutralizing electrons and (ii) determines the available low energy neutralizing electron current that may be produced by the charge neutralization system by monitoring the current flowing through the target electrode.

It is difficult to determine the effectiveness of known charge control systems while ion implantation is occurring. If the charge control system is not providing adequate neutralization of the wafer surface, the residual charge accumulation generates a measurable voltage on the surface of the wafer that has at least two detrimental effects. First, the voltage differential between the implanted wafer surface and the wafer backside may rise to a level that will damage devices being fabricated on the wafer.

Second, the voltage present on the surface of the wafer can cause the ion beam to change shape as it scans from wafer to wafer. For example, wafers in some ion implantation systems typically reside upon wafer pedestals that populate the periphery of a spinning conductive (e.g., aluminum) disk. As the disk spins, the fixed-position ion beam passes from portions of the conductive aluminum disk surface intermediate wafers, to the insulative charged surface of a particular wafer being implanted, and back across conductive disk portions before reaching an adjacent wafer. The voltage present on the surface of a wafer can cause the ion beam to change shape as it passes from one of these surfaces to the next. As such, the voltage on the wafer can cause a non-uniform implanted dose across the planar surface of the wafer, resulting in the well-known "bull's-eye" pattern of implant dosage.

Most ion implanter charge control systems utilize one or more charge monitor pick-ups that attempt to estimate the voltage levels present on the surface of a wafer being implanted. Such charge monitor pick-ups are often referred to as "disk Faradays". The reading provided by the charge pick-up monitor(s) can be used to predict whether devices under fabrication are in danger of being damaged by excessive charge accumulation. Examples of such charge pick-up monitors are shown in U.S. Pat. No. 5,998,798 to Halling, et al., which is hereby incorporated by reference as if fully set forth herein. However, no known charge monitors in ion implantation charge control systems, including that disclosed in U.S. Pat. No. 5,998,798, currently provide any evidence of changes in beam shape as the beam passes between conductive portions of the spinning disk and the insulating portions of the wafers residing thereon.

It is an object of the present invention, then, to provide a mechanism by which changes in ion beam shape may be determined and accounted for in an ion implantation system. It is a further object to provide a mechanism by which one can prevent non-uniform implanted dose across the planar surface of the wafer such that the implanted wafer does not exhibit the well-known "bull's-eye" pattern of implant dosage. It is yet a further object to provide in improved in-process charge monitor and control system for an ion implanter, wherein the effectiveness of a charge neutralization mechanism may be verified in real time and adjusted if necessary.

SUMMARY OF THE INVENTION

An in-process charge monitor and control system for an ion implanter is provided. The monitor and control system includes a rotating wafer support upon which a plurality of wafers may be positioned for implantation by an ion beam, the support having portions thereof disposed intermediate adjacent wafers that are more or less electrically conductive than surfaces of the wafers. Each of the plurality of wafers is positioned substantially equidistant from the center of the disk. The disk is also provided with first and second apertures disposed substantially equidistant from the center, wherein the first aperture located closer in proximity to a wafer than the second aperture. Alternatively, the first and second apertures may each be located equidistant from a wafer but surrounded by portions of the disk having different electrical conductivity characteristics. For example, the first aperture may be provided in a portion of the disk that is aluminum, and the second aperture may be provided in a portion that is silicon coated.

First and second electrical charge monitors positioned behind the disk receive first and second portions of the ion beam through the first and second apertures, respectively. The first and second charge monitors output first and second output signals, respectively, indicative of an amount of ion beam current received by the monitor. A comparator compares the first and second output signals and outputs a third output signal indicative of a difference in ion beam current received by first and second electrical charge monitors. The third output signal is used as an input to a charge neutralization system of the ion implanter to control the supply of low energy electrons produced thereby.

DETAILED DESCRIPTION OF A PREFERRED EMBODIMENT OF THE INVENTION

Figure 1:
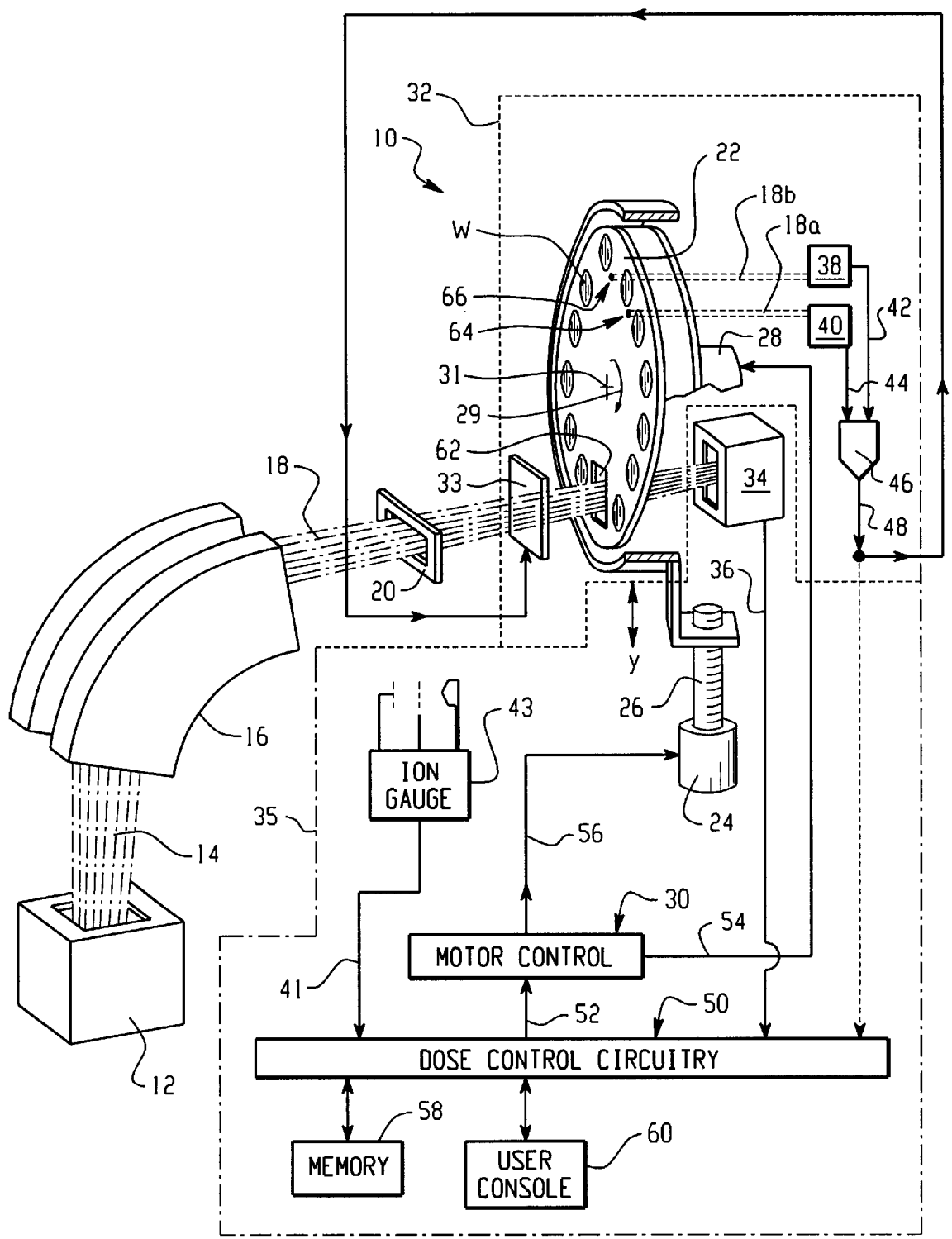
FIG. 1 is a system diagram of an ion implanter into which is incorporated the in-process charge monitor and control system of the present invention.

Referring now to FIG. 1 of the drawings, an ion beam implanter is shown generally at 10. The ion implanter includes an ion source 12, for producing a generally positively charged ion beam 14 that is extracted therefrom by known means, for example, an extraction electrode. A mass analysis magnet 16 mass analyzes the extracted ion beam 14 and outputs a mass analyzed ion beam 18 which includes only those ions having a charge-to-mass ratio that falls within a prescribed range. The mass analyzed ion beam 18 passes through a resolving aperture 20 and is implanted into wafers W situated upon pedestals situated about the periphery of a rotating support or disk 22. The rotating disk in the disclosed embodiment is made of aluminum, although it may be coated with a layer of silicon.

In the case of an aluminum rotating disk 22, the disk would be more electrically conductive than the wafers situated thereon. In the case of a silicon-coated disk 22, the disk would generally be less electrically conductive than the wafers situated thereon (dependent upon whether or not a patterned insulating surface such as a photoresist is applied to the wafers). Generally, the invention acknowledges that the electrical conductivity of the wafers and the portions of the disk that surround them are different. This difference in electrical conductivity may be used to determine whether or not the wafer charge accumulation is adversely affecting the beam passing thereover.

The disk 22 is vertically translated along an axis Y by means of a motor 24 and leadscrew 26. The disk 22 is rotated by means of motor 28, in a direction indicted by arrow 29, about an axis that passes through disk center 31 perpendicularly to the plane of the disk. The wafers W are positioned about the periphery of the disk 22 at locations that are substantially equidistant from the disk center. The full surface area of the wafers W are implanted as they rotate in a circular path (in the "X scan" direction) and are vertically translated ("in the Y scan direction") before the fixed position ion beam 18. Ion dosage received by the wafers W is determined by rotational velocity and the vertical translational velocity of the spinning disk 22, both of which are determined by the motor control 30.

Charge neutralization system 33 is provided for neutralizing the positive charge that would otherwise accumulate on the wafers as they are implanted by the generally positively charged ion beam 18. U.S. Pat. No. 5,959,305, which discloses a known type of charge neutralization system, is hereby incorporated by reference as if fully set forth herein.

The present invention is embodied as an in-process charge monitor and control system 32. The system 32 includes means to measure the amount of charge accumulation on the wafers W that can cause the ion beam to change shape as the disk rotates, causing the beam to successively pass from the wafers to the intermediate portions of the conductive aluminum disk surface. In response to these measurements, the operation of the charge neutralization system 33 may be adjusted or tuned, as further explained below.

Alternatively, the output of system 32 may be used as and input to a dose control system 35 to control the rotation and translation of the spinning disk 22 to insure a uniform implant dose across the entire surface of the wafers W being implanted. The dose control system 35 includes known elements such as a Faraday cage 34 providing an output signal 36. The output 36 from the Faraday cage 34 and an output 41 from a pressure monitor disposed within the implantation chamber, such as an ion gauge 43, are input to the control circuitry 50. The circuitry 50 uses these inputs to determine an appropriate X-scan and Y-scan speed of the wafer in front of the ion beam 18, as is known in the art.

Figure 3:
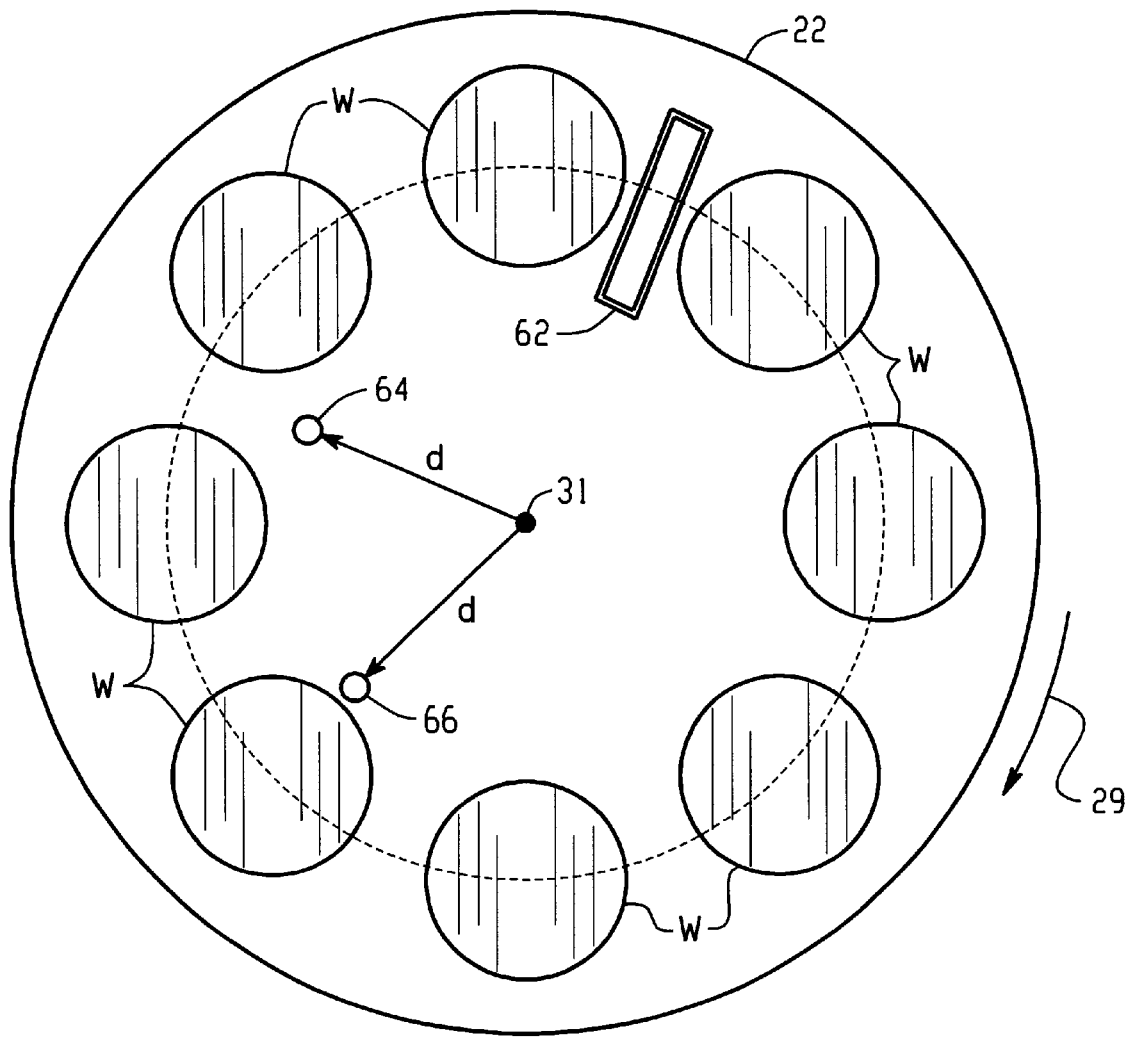
FIG. 3 is a plan view of the wafer support disk of the ion implanter of FIG. 1, upon which wafers to be implanted reside, constructed according to the principles of the present invention.

Specifically, the Faraday cage 34 is mounted behind the spinning disk 22 and is used to measure the ion beam current that passes through slot 62 in the disk. The length of the slot 62 is at least as long as the diameter of the wafers being implanted (e.g., 200 mm or 300 mm) so that the slot will receive ion beam current throughout the entire range of the Y-scan of the wafers (see also FIG. 3). The dose control circuitry 50 outputs control signal 52 to motor control 30 based on the outputs of the Faraday cage 34 and the ion gauge 43. Motor control 30 in turn outputs rotational control signal 54 to motor 28 and vertical translational signal 56 to motor 24, in order to maintain a uniform implantation across the surface of the wafers being implanted. In this manner, the outputs of Faraday cage 34 and the ion gauge 43 are used by the control circuitry 50 to thereby determine the dose of ions implanted into the wafers. The control circuitry also includes memory 58 and a user console or interface 60.

The use of the output of the Faraday cage 34 and ion gauge 43 to control rotational and translation movement of the wafers W in front of the ion beam 18 is known. However, using only these mechanisms may result in non-uniform wafer implants because the ion beam current measurement provided by Faraday cage 34 does not take into account changes or disturbances to the ion beam profile as it passes from portions of the conductive aluminum disk surface intermediate wafers, to the insulative charged surface of a particular wafer being implanted. For example, the ion beam may "blow-up", or become less controllably focused, if it is exposed to a sufficiently positive charge accumulation over the wafer being implanted.

Figure 2:
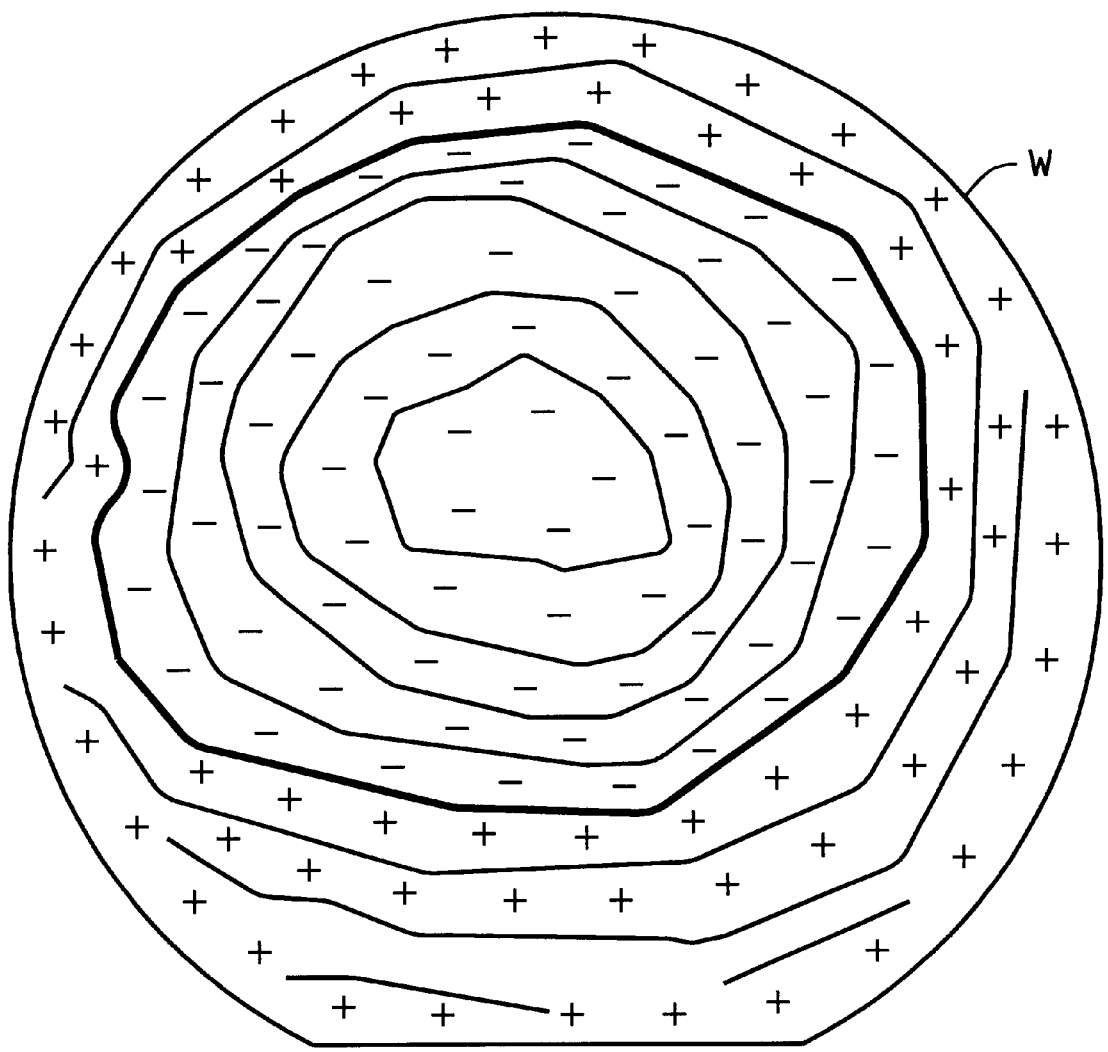
FIG. 2 is a plan view of a wafer implanted by an ion implanter in which the inventive in-process wafer charge monitor and control system is not implemented, showing non-uniformity in implanted dose across the surface of the wafer.

As such, a non-uniform wafer implant may be obtained. FIG. 2 shows one example of such a non-uniform implant, commonly referred to as a "bull's-eye" pattern of non-uniform ion implantation. As shown in FIG. 2, the areas of the implanted wafer marked with "+" indicate areas of overdose (low sheet resistivity), and the areas marked with "−" indicate areas of underdose (high sheet resistivity). FIG. 2 resulted from implanting a 200-mm wafer with boron (B) ions at an energy level of 2 kilo-electron-volts (keV).

As such, the present invention provides an additional ion beam measurement mechanism that takes into account changes or disturbances in ion beam profile, in order to improve dose uniformity across the surface of the wafer. Referring back to FIGS. 1 and 3, the in-process charge monitor and control system 32 includes electrical charge pick-ups or monitors 38 and 40 for outputting signals 42 and 44, respectively, and a comparator 46 for comparing the signals 42 and 44. Apertures 64 and 66 are provided in the disk 22 to receive portions of the ion beam current when it passes thereover. As shown in FIG. 1, portions of the ion beam are shown in phantom as reference numerals 18a and 18b as indicative of the portions of the beam that will pass through aperture 64 and 66, respectively, when the disk 22 rotates from the position shown in FIG. 1.

Aperture 64 and aperture 66 are located the same distance d from disk center 31. As the disk 22 rotates, a first portion 18a of the ion beam current passes through aperture 64 and is measured by charge pick-up or monitor 40, which produces output signal 44. As the disk 22 continues to rotate, a second portion 18b of the ion beam current passes through aperture 66 and is measured by charge pick-up or monitor 38, which produces output signal 42. Aperture 64 is selected at a location where the ion beam is unaffected by the charge accumulation on the wafer, and aperture 66 is selected at a location where the ion beam is affected by the charge accumulation on the wafer. In other words, aperture 66 is located closer to a wafer than is aperture 64.

Alternatively, the first and second apertures may each be located equidistant from a wafer but surrounded by portions of the disk having different electrical conductivity characteristics. For example, aperture 64 may be provided in a portion of the disk that is aluminum, and aperture 66 may be provided in a portion that is silicon coated.

In either case, comparator 46 compares the output signals of charge monitors 38 and 40 to determine the effect, if any, that the charged insulative surfaces of the wafers have on the ion beam profile. For example, in the disclosed embodiment of FIG. 3, if the comparator 46 detects no measurable difference in the first and second portions of the beam current, it can be determined that there is no adverse effect causing beam "blow-up". The negligible comparator output 48 indicates that the charge neutralization system 33 of the ion implanter is operating to effectively neutralize any charge accumulation on the wafers and permit a uniformly dosed implant.

However, if the comparator 46 detects a measurable difference in the first and second portions of the beam current, it can be determined that there is an adverse effect causing beam "blow-up". For example, if the beam is "blown-up", the peak ion beam current measured at aperture 66 would be less than that measured at aperture 64. Alternatively, one can measure the time distribution of the beam as it passes apertures 64 and 66. If the beam is detected for a longer period of time at aperture 66, it indicates a beam "blow-up" condition. In either case, the measurable comparator output 48 indicates that the charge neutralization system 33 of the ion implanter is not operating to effectively neutralize any charge accumulation on the wafers and permit a uniformly dosed implant. As such, the operation of the charge control system (33) may be adjusted or tuned, using comparator output 48, to provide a greater supply of low energy electrons for neutralizing this excess wafer charge accumulation.

Alternatively, the output 48 of comparator 46 may be used instead to adjust the dose control circuitry 50. (As shown in FIG. 1, comparator output 48 is shown in phantom as an alternative input to dose control circuitry 50.) For example, the bull's-eye pattern of FIG. 2 may be correlated to the output 48 of comparator 46. As such, the dosage control circuitry 50 may be programmed to adjust the X-scan and Y-scan speeds of the disk in real time to correct for the anticipated dosage errors. In effect, the dosage control circuitry 50 uses comparator output 48, in addition to the outputs of the ion gauge 43 and the Faraday cage 34, to modify its output control signal 52 to motor control 30. However, it is anticipated that the invention may be more directly implemented as a means to tune the operation of the charge neutralization system 33, as described above.

Accordingly, a preferred embodiment of an in-process charge monitor and control system has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. An in-process charge monitor and control system (32) for an ion implanter, comprising:
   i. a wafer support (22) upon which a plurality of wafers (W) may be positioned for implantation by an ion beam (18), said support having portions thereof disposed intermediate adjacent wafers that are more or less electrically conductive than surfaces of said wafers, said wafer support (22) further having a center (31) from which each of the plurality of wafers is substantially equidistant, said wafer support further provided with first and second apertures (64, 66) disposed substantially equidistant from the said center (31), first and second electrical charge monitors (40, 38) for receiving first and second portions of the ion beam (18a, 18b) passing through said first and second apertures (64, 66), respectively, and for outputting first and second output signals (44, 42), respectively, indicative of an amount of ion beam current received; and
   ii. a comparator (46) for comparing said first and second output signals (44, 42) and for outputting a third output signal (48) indicative of a difference in ion beam current received by first and second electrical charge monitors (40, 48), wherein said wafer support (22) is a rotating disk that rotates about an axis that passes through a center (31) perpendicularly to a plane in which the disk resides, and further wherein said third output signal (48) is used as an input to a charge neutralization system (33) of the ion implanter.

2. The in-process charge monitor and control system (32) of claim 1, wherein said first aperture (64) is located closer in proximity to a wafer than said second apparature (66).

3. The in-process charge monitor and control system (32) of claim 1, wherein said first apparatus (64) and said second aperture (66) are each located substantially equidistant from a wafer (W).

4. The in-process charge monitor and control system (32) of claim 1, wherein said disk (22) is constructed of aluminum and wherein the wafers (W) to be implanted have an insulated layer thereon.

5. The in-process charge monitor and control system (32) of claim 1, wherein said third output signal (48) is used as input to a dose control system (35) of the ion implanter.

6. The in-process charge monitor and control system (32) of claim 1, wherein said disk (22) is silicon coated.

7. An ion implantation system (10), comprising:
  (i) an source (12) for outputting a generally positively charged ion beam (18);
  (ii) a charge neutralization system (33) for producing a supply of low energy electrons for neutralizing the net positive charge of the ion beam; and
  (iii) an in-process charge monitor and control system (32), comprising:
    (a) a wafer support (22) upon which a plurality of wafers (W) may be positioned for implantation by the ion beam (18), said support having portions thereof disposed intermediate adjacent wafers that are more or less electrically conductive than surfaces of said wafers, said wafer support (22) further having a center (31) from which each of the plurality of wafers is substantially equidistant, said wafer support further provided with first and second apertures (64, 66) disposed substantially equidistant from said center (31);
    (b) first and second electrical charge monitors (40, 38) for receiving first and second portions of the ion beam (18*a*, 18*b*) passing through said first and second apertures (64, 66), respectively, and for outputting first and second output signals (44, 42), respectively, indicative of an amount of ion beam current received; and (c) a comparator (46) for comparing said first and second output signals (44, 42), and for outputting a third output signal (48) indicative of a difference in ion beam current received by first and second electrical charge monitors (40, 38), said third output signal (48) used as an input to the charge neutralization system (33) to control the supply of low energy electrons produced thereby.

8. The ion implantation system (10) of claim 7, wherein said first aperture (64) is located closer in proximity to a wafer than said second aperture (66).

9. The ion implantation system (10) of claim 7, wherein said first aperture (64) and said second aperture (66) are each located substantially equidistant from a wafer (W).

10. The ion implantation system (10) of claim 7, wherein said wafer support (22) is a rotating disk that rotates about an axis that passes through center (31) perpendicularly to a plane in which the disk resides.

11. The ion implantation system (10) of claim 10, wherein said disk (22) is constructed of aluminum, and wherein the wafers (W) to be implanted have an insulative layer thereon.

12. The ion implantation system (10) of claim 10, wherein said disk (22) is silicon-coated.

13. A method of neutralizing charge accumulation on a wafer being implanted, comprising the steps of:
  (i) providing a generally positively charged ion beam (18) using an ion source (12);
  (ii) providing a charge neutralization system (33) for neutralizing the generally positively charged ion beam as it is being transported to the surface of a wafer being implanted, by providing a supply of low energy electrons for neutralizing the net positive charge of the ion beam;
  (iii) positioning a plurality of wafers about the periphery of and equidistant from the center (31) of a rotating support (22), said support (22) having portions thereof disposed intermediate adjacent wafers that are more or less electrically conductive than surfaces of said wafers, said wafer support further provided with first and second apertures (64, 66) disposed substantially equidistant from said center (31);
  (iv) monitoring first and second portions of the ion beam (18*a*, 18*b*) passing through said first and second apertures (64, 66);
  (v) outputting first and second output signals (44, 42), respectively, indicative of an amount of ion beam current detected in said first and second portions of the ion beam;
  (vi) comparing said first and second output signals (44, 42) and outputting a third output signal (48) indicative of a difference therebetween; and
  (vii) inputting said third output signal (48) to the charge neutralization system (33) to control the supply of low energy electrons produced thereby.

14. The method of claim 13, wherein said rotating disk (22) is constructed of aluminum, and wherein the wafers (W) to be implanted have an insulative layer thereon.

15. The method of claim 13, wherein said rotating disk (22) is silicon-coated.

16. The method of claim 13, wherein said first aperture (64) is located closer in proximity to a wafer than said second aperture (66).

17. The method of claim 13, wherein said first aperture (64) and said second aperture (66) are each located substantially equidistant from a wafer (W).

* * * * *